(12) United States Patent
Ahn et al.

(10) Patent No.: US 7,485,942 B2
(45) Date of Patent: *Feb. 3, 2009

(54) FILMS DEPOSITED AT GLANCING INCIDENCE FOR MULTILEVEL METALLIZATION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 112 days.

This patent is subject to a terminal disclaimer.

(21) Appl. No.: 11/406,186

(22) Filed: Apr. 18, 2006

(65) Prior Publication Data

US 2006/0208335 A1  Sep. 21, 2006

Related U.S. Application Data

(60) Continuation of application No. 10/900,780, filed on Jul. 28, 2004, now Pat. No. 7,109,563, which is a division of application No. 10/105,672, filed on Mar. 25, 2002, now Pat. No. 6,777,770.

(51) Int. Cl.
  *H01L 29/00* (2006.01)
(52) U.S. Cl. .................. 257/499; 257/324; 257/491; 257/506; 257/508; 257/601
(58) Field of Classification Search ............... 257/324, 257/491, 499, 506, 508, 601; 438/218, 219, 438/257, 294
See application file for complete search history.

(56) References Cited

U.S. PATENT DOCUMENTS

| | | | |
|---|---|---|---|
| 4,962,058 A | 10/1990 | Cronin et al. | |
| 5,055,426 A | 10/1991 | Manning | |
| 5,527,739 A | 6/1996 | Parrillo et al. | |
| 5,798,559 A | 8/1998 | Bothra et al. | |
| 5,866,204 A | 2/1999 | Robbie et al. | |
| 5,953,625 A | 9/1999 | Bang | |
| 5,994,776 A | 11/1999 | Fang et al. | |
| 6,057,224 A | 5/2000 | Bothra | |
| 6,077,792 A | 6/2000 | Farrar | |
| 6,202,065 B1 | 3/2001 | Wills | |

(Continued)

OTHER PUBLICATIONS

"CRC handbook of chemistry and physics", *49th edition, CRC Press,* Cleveland, Ohio, (1968-1969),E-61.

(Continued)

*Primary Examiner*—Long K Tran
(74) *Attorney, Agent, or Firm*—Schwegman, Lundberg & Woessner, P.A.

(57) ABSTRACT

Systems, devices and methods are provided to improve performance of integrated circuits by providing a low-k insulator. One aspect is an integrated circuit insulator structure that includes a vapor-deposited dielectric material. The dielectric material has a predetermined microstructure formed using a glancing angle deposition (GLAD) process. The microstructure includes columnar structures that provide a porous dielectric material. One aspect is a method of forming a low-k insulator structure. In one embodiment, a predetermined vapor flux incidence angle $\theta$ is set with respect to a normal vector for a substrate surface so as to promote a dielectric microstructure with individual columnar structures. Vapor deposition and substrate motion are coordinated so as to form columnar structures in a predetermined shape. Other aspects are provided herein.

29 Claims, 8 Drawing Sheets

U.S. PATENT DOCUMENTS

| | | |
|---|---|---|
| 6,206,065 B1 | 3/2001 | Robbie et al. |
| 6,248,422 B1 | 6/2001 | Robbie et al. |
| 6,255,156 B1 | 7/2001 | Forbes et al. |
| 6,277,728 B1 | 8/2001 | Ahn |
| 6,284,675 B1 | 9/2001 | Jin et al. |
| 6,383,924 B1 | 5/2002 | Farrar et al. |
| 6,509,623 B2 * | 1/2003 | Zhao .................. 257/522 |
| 6,582,512 B2 | 6/2003 | Geusic et al. |
| 6,589,334 B2 | 7/2003 | John et al. |
| 6,908,538 B2 | 6/2005 | Dalmia et al. |
| 7,109,563 B2 | 9/2006 | Ahn et al. |
| 7,132,348 B2 | 11/2006 | Geusic et al. |
| 2003/0075438 A1 | 4/2003 | Dalmia et al. |
| 2004/0266220 A1 | 12/2004 | Ahn et al. |
| 2005/0029501 A1 | 2/2005 | Geusic et al. |

OTHER PUBLICATIONS

Abelmann, L , et al., "Oblique evaporation and surface diffusion", *Thin Solid Films*, 305(1-2), (Aug. 15, 1997),1-21.

Asoh, H , "Fabrication of ideally ordered anodic porous alumina with 63 nm hole periodicity using sulfuric acid", *Journal of Vacuum Science & Technology B (Microelectronics and Nanometer Structures)*, 19(2), (Mar. 2001),567-72.

Chou, S Y., et al., "Imprint lithography with sub-10 nm feature size and high throughput", *Microelectronic Engineering*, 35(1-4), (Feb. 1997),237-40.

Chou, S Y., et al., "Sub-10 nm imprint lithography and applications", *Journal of Vacuum Science & Technology B(Microelectronics and Nanometer Structures)*, 15(6), (Nov.-Dec. 1997),2897-904.

Colgan, M J., et al., "Field emission from carbon and silicon films with pillar microstruture", *Thin Solid Films*, 389(1-2), (Jun. 15, 2001),1-4.

Jeng, Shin-Puu , et al., "A planarized multilevel interconnect scheme with embedded low-dielectric-constant polymers for sub-quarter-micron applications", *VLSI Technology, 1994. Digest of Technical Papers. 1994 Symposium on*, Jun. 7-9, 1994,73-74.

Jin, C , "Evaluation of ultra-low-k dielectric materials for advanced interconnects", *Journal of Electronic Materials*, 30(4), (Apr. 2001),284-9.

Jurczak, M , "SON (silicon on nothing)—a new device architecture for the ULSI era",*VLSI Technology, 1999. Digest of Technical Papers. 1999 Symposium on*, Jun. 14-16, 1999,29-30.

Karunasiri, R.P. U., et al., "Thin-film growth and the shadow instability", *Physical Review Letters*, 62(7), (Feb. 13, 1989),788-91.

Kingery, W D., "Introduction to ceramics", New York, *Wiley*, (1963),262-263.

Kittel, C A., "Introduction to Solid State Physics", *3rd Edition, J. Wiley & Sons*, (1966),25.

Malac, Marak , et al., "Thin Films Deposited at Glancing Incidence and their Applications", *Vacuum Technology & Coating*, (Jul. 2001),48-53.

Messier, R , et al., "Engineered sculptured nematic thin films [solid microstructures]", *Journal of Vacuum Science & Technology A (Vacuum, Surface, and Films)*, 15(4), (Jul.-Aug. 1997),2148-52.

Mizushima, I. , "Empty-space-in-silicon technique for fabricating a silicon-on-nothing structure", *Applied Physics Letters*, 77(20), American Institute of Physics, NY,(Nov. 13, 2000),3290-3292.

Morey, George W., "The properties of glass", Published New York, *Reinhold publishing corporation, Series Monograph series (American Chemical Society)* ; No. 77., (1938),12, 48-49.

Nichols, F. A., et al., "Surface- (interface-) and volume-diffusion contributions to morphological changes driven by capillarity", *Transactions of the American Institute of Mining, Metallurgical and Petroleum Engineers*, 233(10), (1965),1840-8.

Pandya, D K., "Obliquely deposited amorphous Ge films. I. Growth and structure", *Journal of Applied Physics*, 46(7), (Jul. 1975),2966-75.

Robbie, K , et al., "Sculptured thin films and glancing angle deposition: growth mechanics and applications", *Journal of Vacuum Science & Technology A (Vacuum, Surfaces, and Films)*, v 15, n 3, pt.2, (May-Jun. 1997),1460-5.

Sato, T , "A new substrate engineering for the formation of empty space in silicon (ESS) induced by silicon surface migration", *International Electron Devices Meeting 1999. Technical Digest*, (1999),517-20.

Sato, T , "Trench transformation technology using hydrogen annealing for realizing highly reliable device structure with thin dielectric films", *1998 Symposium on VLSI Technology Digest of Technical Papers*, (1998),206-7.

Tait, R N., et al., "Modelling and characterization of columnar growth in evaporated films", *Thin Solid Films*, 226(2), (Apr. 30, 1993),196-201.

Thornton, T A., "High rate thick film growth", *Annual review of materials science*, vol. 7, (1977),239-60.

Treichel, H , "Low dielectric constant materials", *Journal of Electronic Materials*, 30(4), (Apr. 2001),290-8.

Wolf, S., *Silicon Processing for the VLSI Era—Vol 1: Process Technology, Second Edition*, Lattice Press, Sunset Beach, California,(2000), 719-727, 791-795.

U.S. Appl. No. 10/105,672 Non final office action mailed Sep. 11, 2003, 17 pgs.

U.S. Appl. No. 10/105,672 Notice of allowance mailed Mar. 31, 2004, 11 pgs.

U.S. Appl. No. 10/105,672 Response filed Dec. 11, 2003 to Non final office action mailed Sep. 11, 2003, 17 pgs.

* cited by examiner

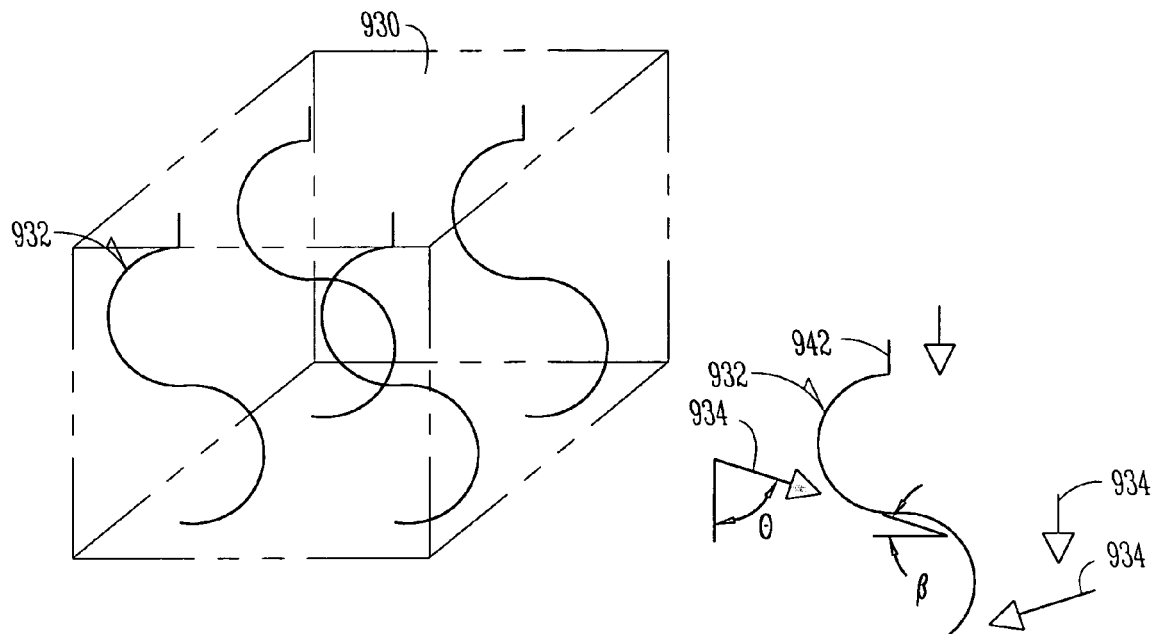
*Fig. 9A*
*Fig. 9B*
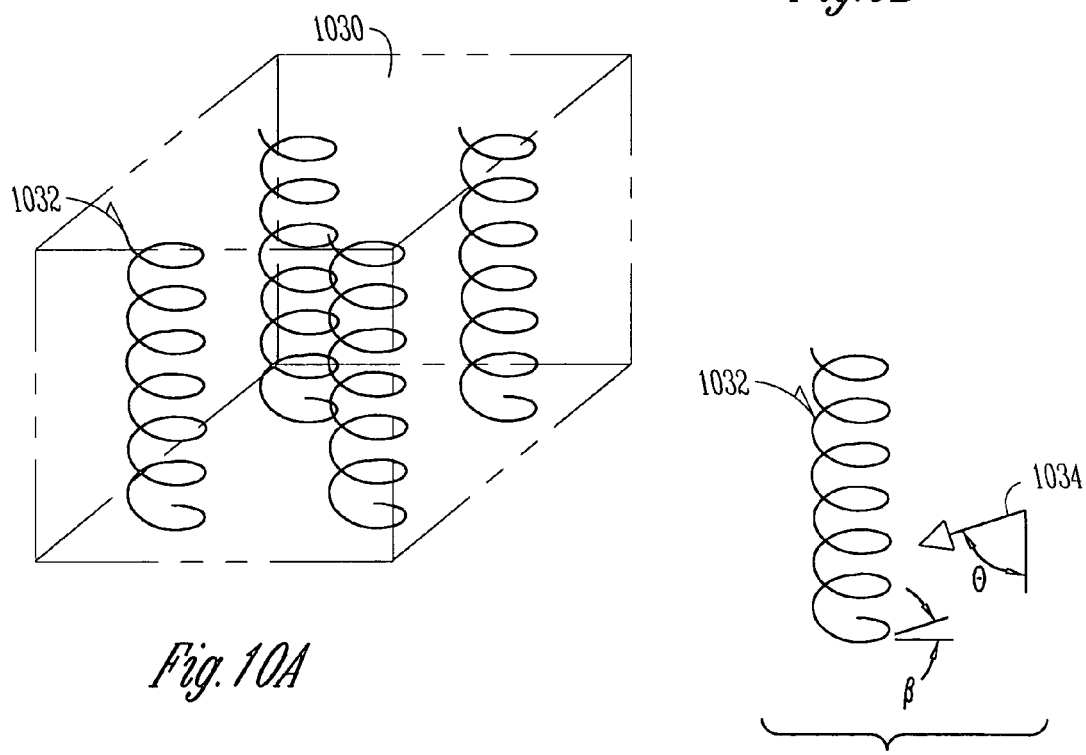
*Fig. 10A*
*Fig. 10B*

FILMS DEPOSITED AT GLANCING INCIDENCE FOR MULTILEVEL METALLIZATION

CROSS REFERENCE TO RELATED APPLICATIONS

This application is a continuation of U.S. application Ser. No. 10/900,780, filed Jul. 28, 2004, now issued as U.S. Pat. No. 7,109,563, which is a divisional of U.S. application Ser. No. 10/105,672, filed Mar. 25, 2002, now issued as U.S. Pat. No. 6,777,770. These applications are incorporated herein by reference.

This application is related to the following, commonly assigned U.S. patent application which is herein incorporated by reference in its entirety: "Low K Interconnect Dielectric Using Surface Transformation," U.S. application Ser. No. 10/106,915, filed Mar. 25, 2002, now issued as U.S. Pat. No. 7,132,348.

TECHNICAL FIELD OF THE INVENTION

This invention relates generally to integrated circuits and, more particularly, to integrated circuit dielectrics useful for reducing the signal delay time attributable to interconnects.

BACKGROUND OF THE INVENTION

The semiconductor industry continuously strives to reduce the size and cost of integrated circuits. It is common in the semiconductor art to use layers of metal, polysilicon, or another conductor to conduct current between various semiconductor structures with an integrated circuit, and to external terminals for the integrated circuit, by means of conductive vias. One method for measuring the performance of an integrated circuit uses the maximum clock speed at which the circuit operates reliably, which depends on how fast transistors can be switched and how fast signals can propagate.

One particular problem confronting the semiconductor industry is that, as integrated circuit scaling continues, the performance improvement is limited by the signal delay time attributable to interconnects in the integrated circuit. That is, the capacitance at metal interconnects increases as the density of the integrated circuit increases. According to one definition, integrated circuit interconnects are three-dimensional metal lines with submicrometer cross sections surrounded by insulating material. One definition of an interconnect delay is the product of the interconnect resistance (R) and the parasitic capacitance (C) for the interconnect metal to the adjacent layers. Because of the progressive scaling, the parasitic capacitance (C) has significantly increased due to closer routing of wires, and the interconnect resistance (R) has significantly increased due to a continuous reduction of the wire section.

The following approximations for various generations of integrated circuit technology illustrates this problem. For example, the delay in 0.7 μm technology is about 500 ps, in which about 200 ps seconds are attributable to gate delays and about 300 ps are attributable to interconnect delays. The delay in 0.18 μm technology is about 230 ps, in which about 30 ps are attributable to gate delays and about 200 ps are attributable to interconnect delays. As integrated circuit scaling continues, it is desirable to lower the interconnect RC time constant by using metals with a high conductivity. One high conductivity metal used to lower the RC constant is copper. The use of copper in 0.18 μm technology improves the interconnect delays to about 170 ps. However, even though the delay attributable to the gates continues to decrease as scaling continues beyond the 0.18 μm technology, the overall delay increases significantly because the interconnect delay is significantly increased. It has been estimated that as much as 90 percent of the signal delay time in future integrated circuit designs may be attributable to the interconnects and only 10 percent of the signal delay may be attributable to transistor device delays. As such, it is desirable to lower the interconnect RC time constant by using materials with a low dielectric constant (k).

One direction for developing low-k dielectrics incorporates air into dielectrics to make them porous. The dielectric constant of the resulting porous material is a combination of the dielectric constant of air (k≈1) and the dielectric constant of the dielectric material. As such, it is possible to lower the dielectric constant of a low-k dense material by making the dielectric material porous. However, some methods for providing porous dielectric materials involve rather complex processing steps that are difficult to consistently perform, which increases the time and cost of processing.

Therefore, there is a need in the art to provide a system and method that improves integrated circuit performance by reducing the interconnect RC time constant. There is a need in the art to provide a low-k dielectric insulator for the interconnects that is easily and consistently prepared in a timely and cost-effective manner.

SUMMARY OF THE INVENTION

The above mentioned problems are addressed by the present subject matter and will be understood by reading and studying the following specification. The present subject matter provides a low-k dielectric insulator for integrated circuit interconnects that is easily and consistently prepared in a timely and cost-effective manner. The low-k dielectric insulator of the present invention is vapor deposited at predetermined angles of incidence with respect to a normal vector of a substrate surface so as to promote columnar growth that results in porous dielectric microstructures. Various parameters are capable of being manipulated to control the columnar morphology to achieve the desired dielectric characteristics. These parameters include deposition rate, deposition temperature, incident angle θ of vapor flux, substrate rotation (angular position φ and angular rate ω), and initial morphology of a patterned or modulated substrate surface. As such, the present invention provides a system and method that improves integrated circuit performance by reducing the interconnect RC time constant.

One aspect of the present subject matter is an integrated circuit insulator structure. One embodiment of the structure includes a vapor-deposited dielectric material. The dielectric material has a predetermined microstructure formed using a glancing angle deposition (GLAD) process. The microstructure includes columnar structures that provide a porous dielectric material.

One aspect of the present subject matter is a method of forming a low-k insulator structure. In one embodiment, a predetermined vapor flux incidence angle θ is set with respect to a normal vector for a substrate surface so as to promote a dielectric microstructure with individual columnar structures. Vapor deposition and substrate motion are coordinated so as to form columnar structures in a predetermined shape.

These and other aspects, embodiments, advantages, and features will become apparent from the following description of the invention and the referenced drawings.

BRIEF DESCRIPTION OF THE DRAWINGS

FIGS. 9A-9B illustrate a dielectric volume, such as that bounded by the metal levels shown in FIG. 4, with S-shaped columnar structures as formed by one embodiment of the system of FIG. 6.

FIGS. 10A-10B illustrate a dielectric volume, such as that bounded by the metal levels shown in FIG. 4, with helical-shaped columnar structures as formed by one embodiment of the system of FIG. 6.

DETAILED DESCRIPTION OF THE INVENTION

Figure 1:
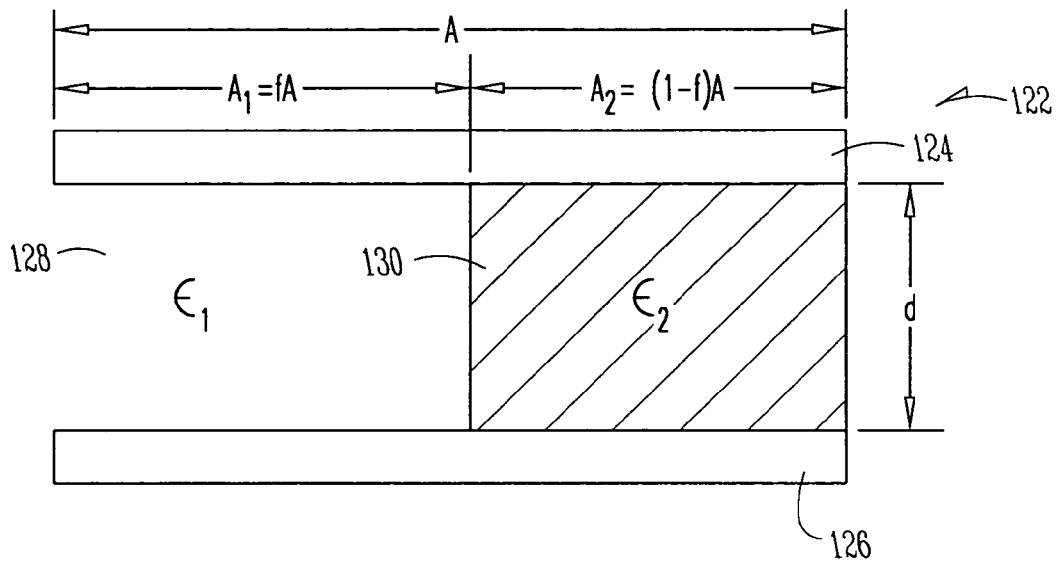
FIG. 1 illustrates a parallel capacitor model for two distinct dielectrics in parallel with each other, the first dielectric having a permittivity of $\in_1$, or a permittivity of free space ($\in_0$), and the second dielectric having a permittivity of $\in_2$.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present subject matter improves integrated circuit performance by reducing the RC time delays attributable to interconnects. The present subject matter provides a low-k dielectric insulator of controlled porosity, which reduces the effective dielectric constant ($k_{eff}$) of the insulator. The present subject matter provides systems, devices and methods that involve forming porous dielectric materials by promoting columnar growth through glancing angle deposition (GLAD). Various embodiments further control the microstructure of the porous dielectric material and thus the dielectric constant (k) of the material by varying the vapor flux incidence angle θ and/or otherwise controlling substrate/wafer motion.

Figure 2:
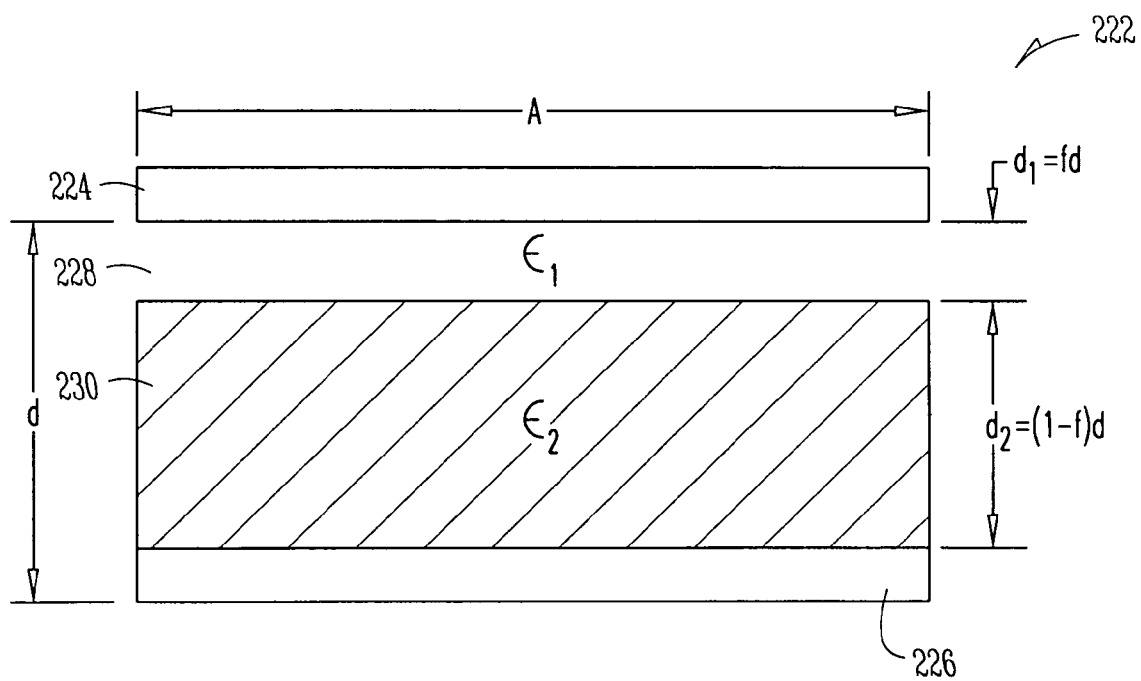
FIG. 2 illustrates a series capacitor model for two distinct dielectrics in series with each other, the first dielectric having a permittivity of $\in_1$, or a permittivity of free space ($\in_0$), and the second dielectric having a permittivity of $\in_2$.
Figure 3:
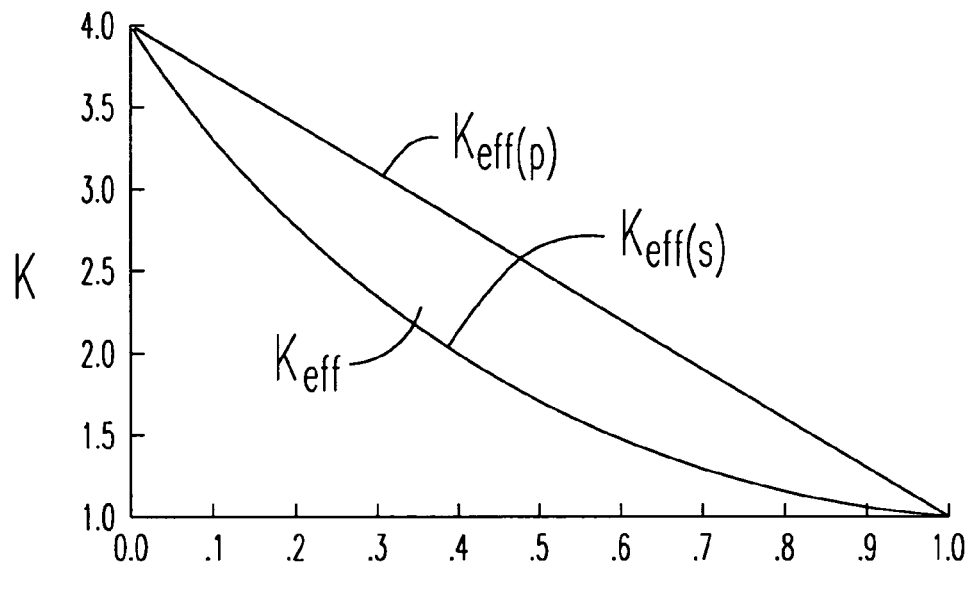
FIG. 3 illustrates plots of $k_{eff(P)}$ and $k_{eff(S)}$ which are plotted as a function of the filling factor "f" and for $k_2$ equal to 4.0 ($\approx k$ of $SiO_2$), which are shown in FIGS. 1 and 2.

FIGS. 1-3 introduce the desirable effect that porosity has on dielectric materials. The porosity of the material can be considered to be air-filled voids. The dielectric constant of the resulting porous material is a combination of the dielectric constant of air (k≈1) and the dielectric constant of the dielectric material. As such, the air-filled voids, or porosity of the material, provides the dielectric material with a lower effective dielectric constant (k) so as to lower the interconnect RC time constant.

FIG. 1 illustrates a parallel capacitor model for two distinct dielectrics in parallel with each other, the first dielectric having a permittivity of $\in_1$, or a permittivity of free space ($\in_0$), and the second dielectric having a permittivity of $\in_2$. The capacitor 122 has a first electrode 124 and a second electrode 126. The first electrode 124 and the second electrode 126 both have a length (A) and are separated by a distance (d). A first dielectric 128 is formed between the first and second electrodes, and a second dielectric 130 is formed between the first and second electrodes and parallel to the first dielectric. The first dielectric extends a distance $A_1$, which is a fraction of the length A, from one end of the electrodes as provided by the following equation:

$$A_1 = f \times A. \quad (1)$$

The variable "f" represents the fraction (or filling factor) of the first dielectric 128, which is air (k≈1) in one embodiment. The second dielectric 130 extends a distance $A_2$, which is a fraction of the length A, from the opposing end of the electrodes as provided by the following equation:

$$A_2 = A - A_1 = (1-f) \times A. \quad (2)$$

The effective dielectric constant ($k_{eff(P)}$) for the parallel capacitor model is represented by the following equation:

$$k_{eff(P)} = f + k_2 \times (1-f). \quad (3)$$

FIG. 2 illustrates a series capacitor model for two distinct dielectrics in series with each other, the first dielectric having a permittivity of $\in_1$, or a permittivity of free space ($\in_0$), and the second dielectric having a permittivity of $\in_2$. The capacitor 222 has a first electrode 224 and a second electrode 226. The first electrode 224 and the second electrode 226 both have a length (A) and are separated by a distance (d). A first dielectric 228 is formed in series with a second dielectric 230 between the first and second electrodes. The first dielectric 228 has a width d1, which is a fraction of the distance d as represented by the following equation:

$$d_1 = f \times d. \quad (4)$$

The variable "f" represents the fraction (or filling factor) of the first dielectric 228, which is air (k≈1) in one embodiment. The second dielectric has a width d2, which is fraction of the distance d as represented by the following equation:

$$d_2 = d - d_1 = (1-f) \times d. \quad (5)$$

The effective dielectric constant ($k_{eff}(S)$) for the series capacitor model is represented by the following equation:

$$k_{eff(S)} = \frac{1}{f + (1-f) \times \frac{1}{k_2}}. \quad (6)$$

FIG. 3 illustrates plots of $k_{eff}(P)$ and $k_{eff}(S)$ which are plotted as a function of the filling factor "f" and for $k_2$ equal to 4.0 (which is approximately the dielectric constant of silicon dioxide (SiO$_2$)), which are shown in FIGS. 1 and 2. One of ordinary skill in the art will recognize that similar plots can be made for other dielectric constant values, and will further recognize that even lower effective dielectric constants are capable of being achieved by forming a porous dielectric material starting with a dielectric material that has a lower dielectric constant ($k_2$) than SiO$_2$. The effective dielectric constant ($k_{eff}$) of a material of dielectric constant $k_2$ with embedded empty spaces depends on the detailed size, shape orientation and spacing of the empty spaces relative to a set of parallel electrodes. However, the $k_{eff}$ for the material with a dielectric constant $k_2$ with embedded empty spaces is bounded between the effective capacitance for the parallel capacitor model ($k_{eff}(P)$) and the effective capacitance for the series capacitor model ($k_{eff}(S)$).

One of ordinary skill in the art will understand, from reading and comprehending this disclosure, that it is desirable to form the microstructure with higher filling factors (f) of air. FIG. 3 indicates that, for a given filling factor (f) larger than 0.0 and smaller than 1.0, the effective dielectric constant is lower for the series capacitor model ($k_{eff}(S)$) than for the parallel capacitor model ($k_{eff}(P)$). For a given filling factor (f) of air, one of ordinary skill in the art will also understand, from reading and comprehending this disclosure, that it is desirable to form the microstructure of the dielectric material such that the microstructure more closely resembles the series capacitor model ($k_{eff}(S)$).

Figure 4:
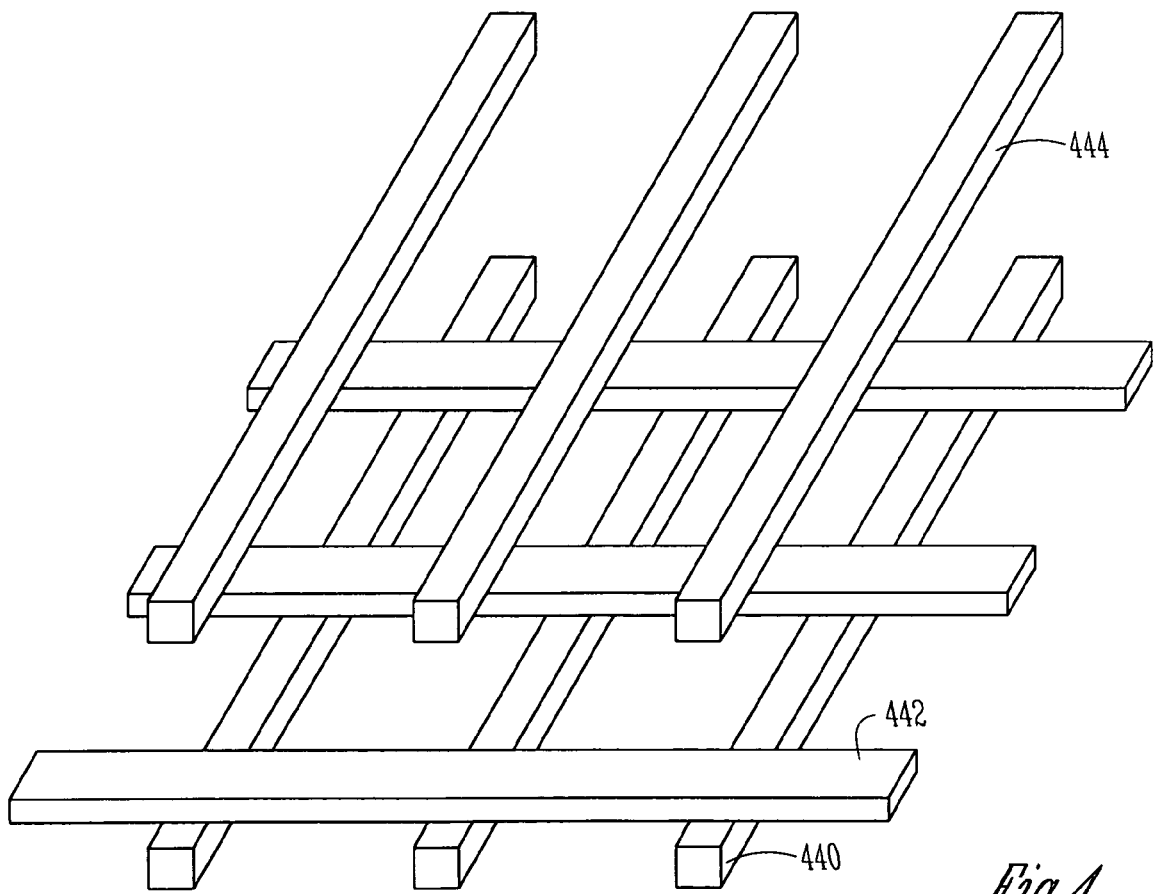
FIG. 4 illustrates metal levels for an integrated circuit.

FIG. 4 illustrates metal levels for an integrated circuit. The figure illustrates a first metal level 440, a second metal level 442, and a third metal level 444. The metal levels lie in approximately parallel planes. Individual lines within the metal levels typically run either parallel to or orthogonally to individual lines in other metal levels. The metal levels are separated by inter-layer dielectrics (not shown). The metal levels form boundaries for dielectric regions, or volumes, between the individual lines and the metal levels. A goal is to maximize the amount of air that is incorporated into these dielectric volumes by depositing the dielectric films at a glancing incidence.

Figure 5:
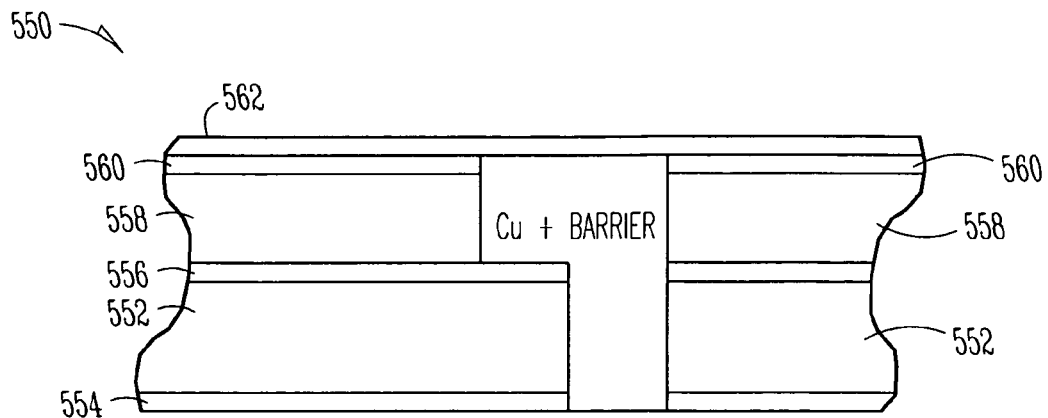
FIG. 5 illustrates one embodiment of low-k dielectrics within multilevel metalization.

FIG. 5 illustrates one embodiment of low-k dielectrics within multilevel metalization. The illustrated structure 550 includes a first layer 552 of low-k dielectric material sandwiched between first and second etch stop layers 554 and 556 and a second layer 558 of low-k dielectric material sandwiched between the second etch stop layer and chemical mechanical polishing (CMP) stop layer 560. The illustrated structure further includes a copper diffusion/oxidation barrier 562 on top of the CMP stop layer 560, which is deposited as desired. According to one embodiment, the low-k dielectric material includes silicon dioxide (SiO$_2$) deposited according to the teachings of the present invention. According to another embodiment, the low-k dielectric material includes silicon monoxide (SiO) deposited according to the teachings of the present invention.

As will be described in more detail below, the dielectric constant of the material is capable of being lowered to approximately 50% of the dielectric constant of normal films by adjusting the angle of incidence θ for the incoming vapor flux to a sufficiently large θ; i.e. by using a glancing angle deposition (GLAD) process. GLAD processes increase the distance between columnar structures in the microstructure of the dielectric material such that the porosity of the dielectric material is increased, and the dielectric constant is lowered. As such, the dielectric constant of SiO$_2$ deposited with the GLAD process is expected to be around 1.95, and the dielectric constant of SiO is expected to be slightly less than the dielectric constant of SiO$_2$.

As analyzed by Malac et al. et al. (Malac et al., Vacuum Technology and Coating, p 48-53, 2001), thin films deposited by physical vapor deposition (PVD) exhibit a columnar morphology when prepared at low substrate temperature so that diffusion of the arriving atoms is limited. Limiting the diffusion of arriving atoms, which tends to smooth out the surface, allows for a better control of the film morphology. Orientating the substrate to an oblique angle with respect to the incident flux encourages columnar morphology at these low substrate temperatures, and even at higher substrate temperatures. The resulting film morphology is controlled by the angle of incidence and the substrate-rotation rate, among other things.

A columnar, porous microstructure occurs when atomic diffusion is inhibited during growth. This growth has been described by analogy using the grassy lawn model. In this model, blades of grass represent columns of growth, and light represents incoming vapor flux. Grass grows proportionally to the amount of light they receive. Similarly, the columns grow proportionally to the amount of incoming vapor flux they receive. A blade of grass that overgrows and shadows neighboring blades of grass receives more light, and as such will grow faster, whereas the growth of the neighboring blades of grass is stunted because of the larger blade of grass blocks light. Similarly, larger columns receive more incoming vapor flux at the expense of their smaller neighbors. This columnar growth can be viewed as positive feedback since the larger columns have a faster growth rate than the smaller columns. The growth rate of the larger columns is at the expense of the growth rate for the smaller columns because of the shadowing effect.

Process parameters are capable of being manipulated to either promote or inhibit the growth of individual columns for almost any material of interest, although various material requires various ranges of conditions to promote columnar growth. Some of these process parameters that influence columnar growth include the substrate temperature, the incidence angle θ of vapor flux with respect to substrate normal, the angular position φ and the angular rate ω of substrate rotation, the deposition rate, and the initial substrate surface morphology. Some of these parameters are illustrated in the system of FIG. 6.

Figure 6:
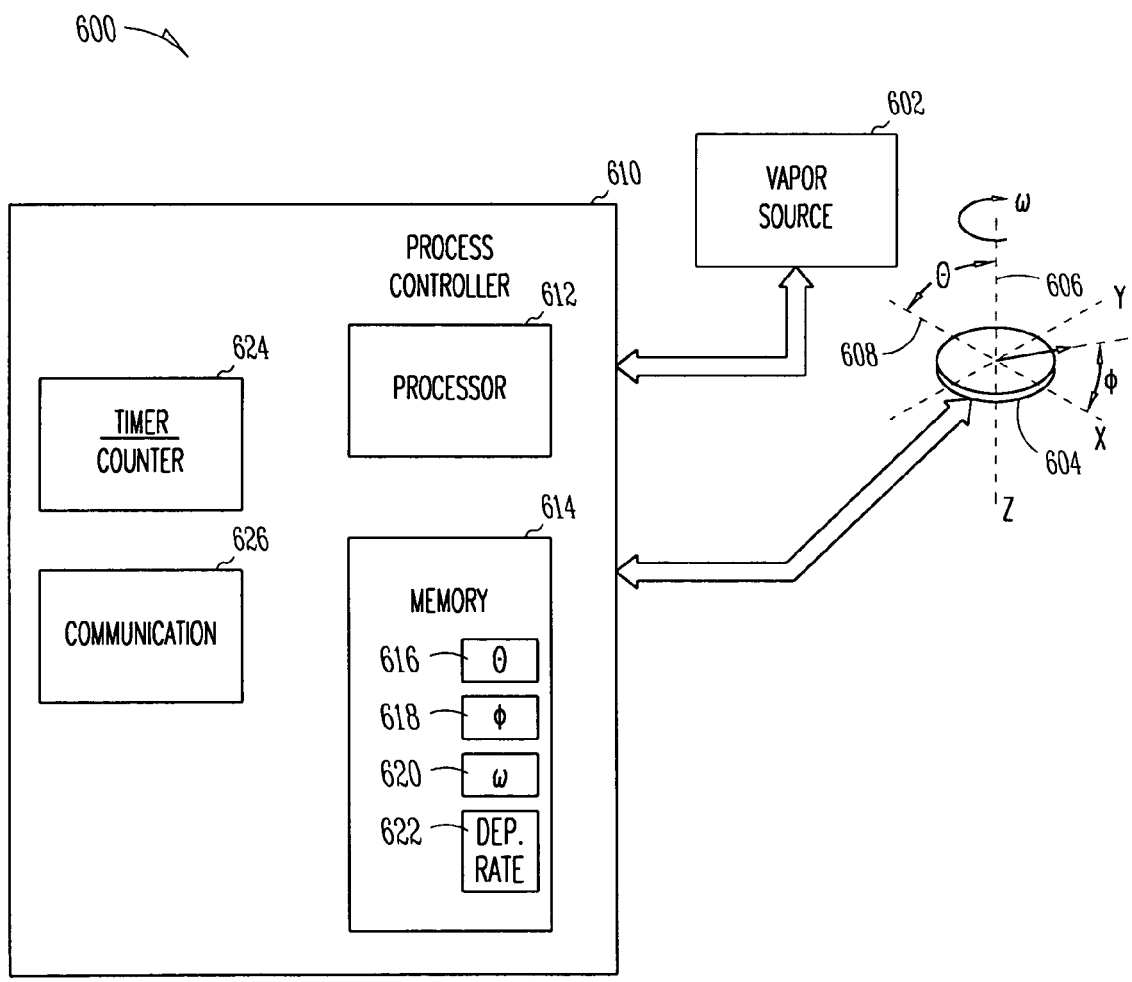
FIG. 6 illustrates one embodiment of a system according to the present invention for depositing low-k dielectric films at a glancing incidence for multilevel metallization.

FIG. 6 illustrates one embodiment of a system according to the present invention for depositing low-k dielectric films at a glancing incidence for multilevel metallization. The illustrated system 600 includes a vapor source 602 operably positioned with respect to a substrate or wafer 604. One of ordinary skill in the art will understand, upon reading and comprehending this disclosure, that the system includes a substrate holder and a substrate motion mechanism, which are not shown so as not to unduly complicate the illustration. According to one embodiment, the substrate holder and the substrate motion mechanism are adapted to position the substrate 604 at a predetermined vapor flux incidence angle θ with respect to substrate normal 606, the angular position φ with respect to a predetermined substrate position and/or the angular rate ω of substrate rotation. The vapor source 602 is capable of providing a predetermined vapor flux 608 toward the substrate 604.

One embodiment of the system 600 is capable of monitoring the vapor flux and the substrate motions (θ, φ, ω), and adjusting the adjusting the vapor flux and the substrate motions (θ, φ, ω) appropriate to achieve a desired inter-layer dielectric microstructure. One embodiment of the system includes a process controller 610 for performing the monitoring and adjusting functions. One embodiment of the process controller 610 includes a processor 612 in communication with a memory 614. The memory 614 includes software that contains computer-readable instructions. The software includes module(s) 616 for monitoring and adjusting the incidence angle θ of the vapor flux with respect to the substrate, module(s) 618 for monitoring and adjusting the angular position φ of the substrate, module(s) 620 for monitoring and adjusting the angular rate ω of substrate rotation, and module(s) 622 for monitoring and adjusting the deposition rate of the vapor flux from the vapor source. One of ordinary skill in the art will understand that various logic circuits are capable of performing the functions of these software modules. A timer or counter 624 is used by the processor 612 to control the coordination of the vapor deposition and the substrate motion. Communication circuitry 626 is in communication with the processor 612, and is adapted to, among other things, receive sensor signals from the vapor source and the substrate holder and motion mechanism, and is further adapted to send appropriate control signals to the vapor source and the substrate motion mechanism.

Substrate Temperature

Atomic diffusion is inhibited at lower substrate temperatures. As such, lower substrate temperatures promote columnar growth. Another advantage of using lower substrate temperatures during processing is that higher processing temperatures are capable of damaging underlying devices within the substrate.

At higher substrate temperatures at which atomic diffusion is not inhibited, the relative relationship between shadowing and diffusion allows voids to be formed in continuous film. The resulting characteristics of these voids depends on the deposition rate, the amount of atomic diffusion, and the columnar morphology of the dielectric film. As discussed in more detail below, a number of factors influence the columnar morphology of the film. One example of atomic diffusion is provided in the co-pending, commonly assigned U.S. patent application "Low K Interconnect Dielectric Using Surface Transformation," U.S. application Ser. No. 10/106915, filed Mar. 25, 2002, which has been incorporated by reference herein in its entirety.

Vapor Flux Incidence Angle θ

FIG. 6 illustrates the incidence angle θ of vapor flux with respect to substrate normal. A thin dielectric film is deposited on the substrate 604 via vapor flux 608 provided by the vapor source 602. The substrate is moved, tilted or otherwise orientated so as to provide a non-normal angle of incidence θ of the vapor flux with respect to the substrate surface. The axis 606 represents the normal of the substrate surface. A stronger influence of shadowing occurs when the substrate 604 is moved obliquely (non-normal) with respect to the incoming vapor flux 608, such that a stronger probability exists that the film will develop into a porous microstructure that includes isolated columns. Orientating the substrate at an oblique angle introduces a directional anisotropy to the deposition process because the growth direction of the columns generally follows the direction of the incoming vapor flux. As such, performing a deposition process with the incident flux at an angle θ with respect to substrate normal results in columns that grow from the substrate at an angle β, shown in FIGS. 7B, 8B and 9B, from the substrate normal such that the incidence angle θ is approximately complementary to the angle β (i.e. θ≈90°−β). The shadowing influence is stronger and the spacing between columns increases as the vapor flux incidence angle θ increases. Deposition processes that have a larger vapor flux incidence angle θ (θ>70°) are referred to as glancing angle deposition (GLAD) processes.

Columns of various shapes can be grown by varying the incidence angle θ at appropriate times during the deposition process. For example, these shapes include separated chevrons, staircases, C-shaped columns, S-shaped columns and zig-zags. As one of ordinary skill in the art will understand upon reading and comprehending this disclosure, the dimensions of these shapes are determined by various processing parameters the deposition rate and the length of time that the incident angle is at certain values.

Figure 7A:
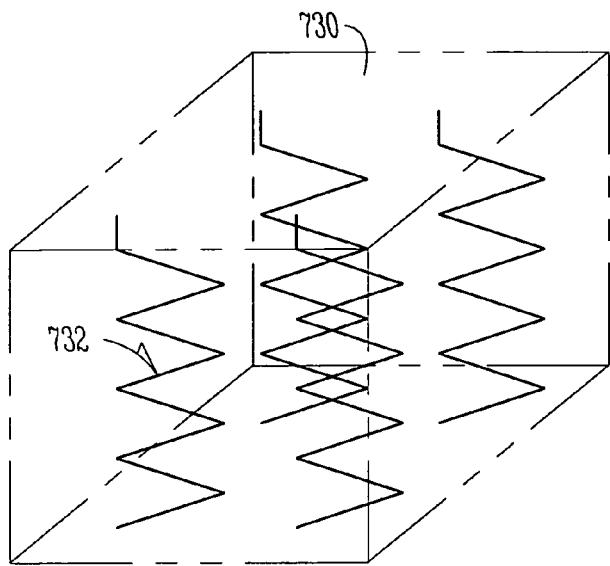
FIGS. 7A-7B illustrate a dielectric volume, such as that bounded by the metal levels shown in FIG. 4, with zig-zag-shaped columnar structures as formed by one embodiment of the system of FIG. 6.
Figure 7B:
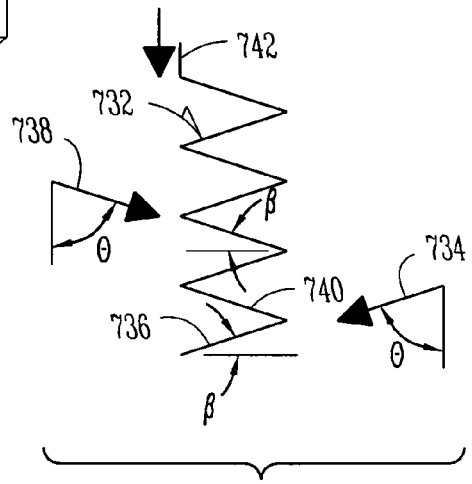

FIGS. 7A-7B illustrate a dielectric volume, such as that bounded by the metal levels shown in FIG. 4, with zig-zag-shaped columnar structures as formed by one embodiment of the system of FIG. 6. The dielectric volume 730 illustrated in FIG. 7A includes four equally-spaced zig-zag structures 732. One of ordinary skill in the art will understand that the FIG. 7A generally illustrates concepts of the present invention, and will be able to apply the teachings of the present invention to fabricate low-k dielectric for a variety of volumes.

FIG. 7B illustrates a zig-zag-shaped columnar structure and, by use of arrows, the incoming vapor flux. The vapor flux angle of incidence θ generally corresponds to the angle β at which the columnar structures grow with respect to the substrate surface. One method embodiment for forming the zig-zag-shaped columnar structures include vapor depositing a dielectric at a predetermined vapor flux angle of incidence θ and a predetermined angular position φ of the substrate. According to one embodiment, θ is greater than 70° such that the deposition process is a GLAD process. This is generally illustrated by arrow 734. The deposition process continues for a predetermined amount of time to grow the first leg 736 of the columnar structure. According to the illustrated embodiment, the substrate is rotated approximately 180° (i.e. $\phi_{New} = \phi_{Old} + 180°$) such that the incoming vapor flux with respect to the substrate is generally illustrated by the arrow 738. The deposition process continues for a predetermined amount of time to grow the second leg 740 of the columnar structure 732. The process continues to complete the remainder of the legs in a predetermined zig-zag pattern. According to one embodiment, the substrate is moved such that the predetermined vapor flux angle of incidence θ is approximately 0° for the last leg 742 of the structure. The deposition process continues for a predetermined amount of time, such as a few seconds, so as to promote the growth of a normal looking film at the surface.

Figure 8A:
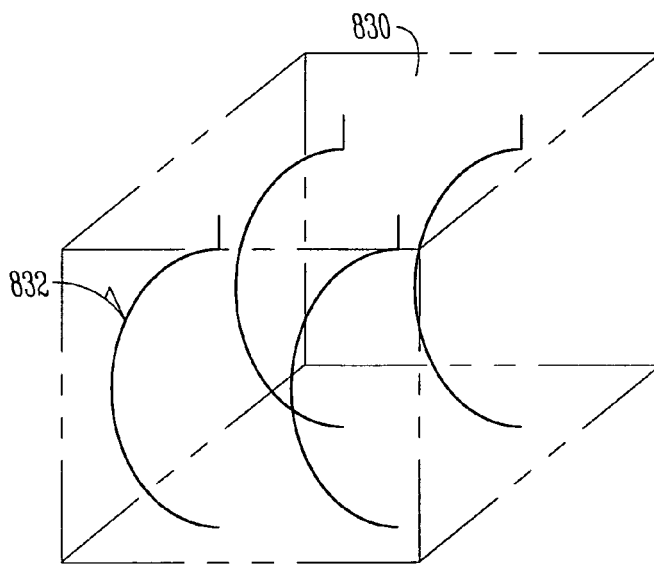
FIGS. 8A-8B illustrate a dielectric volume, such as that bounded by the metal levels shown in FIG. 4, with C-shaped columnar structures as formed by one embodiment of the system of FIG. 6.
Figure 8B:
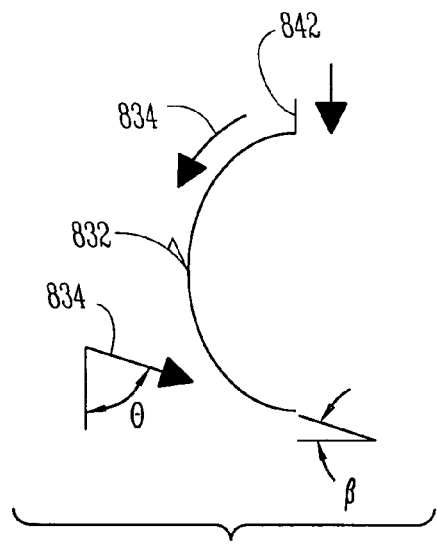

FIGS. 8A-8B illustrate a dielectric volume, such as that bounded by the metal levels shown in FIG. 4, with C-shaped columnar structures as formed by one embodiment of the system of FIG. 6. The dielectric volume 830 illustrated in FIG. 8A includes four equally-spaced C-shaped columnar structures 832. One of ordinary skill in the art will understand that the FIG. 8A generally illustrates concepts of the present invention, and will be able to apply the teachings of the present invention to fabricate low-k dielectric for a variety of volumes.

FIG. 8B illustrates a C-shaped columnar structure and, by use of arrows, the incoming vapor flux. In this embodiment, the vapor flux angle of incidence θ varies continuously. Arrows 834 represent the incoming vapor flux at various stages of growth. One of ordinary skill in the art will understand, upon reading and understanding this disclosure, how to appropriately move the substrate so as to achieve the desired vapor flux angle of incidence θ to achieve the growth of a C-shaped columnar structure. According to one embodiment, the substrate is moved such that the predetermined vapor flux angle of incidence θ is approximately 0° for the last leg 842 of the structure. The deposition process continues for a predetermined amount of time, such as a few seconds, so as to promote the growth of a normal looking film at the surface.

FIGS. 9A-9B illustrate a dielectric volume, such as that bounded by the metal levels shown in FIG. 4, with S-shaped columnar structures as formed by one embodiment of the system of FIG. 6. The dielectric volume 930 illustrated in FIG. 9A includes four equally-spaced S-shaped columnar structures 932. One of ordinary skill in the art will understand that the FIG. 9A generally illustrates concepts of the present invention, and will be able to apply the teachings of the present invention to fabricate low-k dielectric for a variety of volumes.

FIG. 9B illustrates an S-shaped columnar structure and, by use of arrows, the incoming vapor flux. In this embodiment, the vapor flux angle of incidence θ varies continuously. Arrows 934 represent the incoming vapor flux at various stages of growth. One of ordinary skill in the art will understand, upon reading and understanding this disclosure, how to appropriately move the substrate so as to achieve the desired vapor flux angle of incidence θ to achieve the growth of an S-shaped columnar structure. According to one embodiment, the substrate is moved such that the predetermined vapor flux angle of incidence θ is approximately 0° for the last leg 942 of the structure. The deposition process continues for a predetermined amount of time, such as a few seconds, so as to promote the growth of a normal looking film at the surface.

FIGS. 7A-7B, 8A-8B and 9A-9B illustrate various microstructures capable of being formed according to the present invention. The invention is not limited to these shapes, however. One of ordinary skill in the art will understand, upon reading and comprehending this disclosure, how to vary the processing parameters to achieve a desired fill factor (f), as previously discussed with respect to FIGS. 1-3. Furthermore, one of ordinary skill in the art will understand, upon reading and comprehending this disclosure, how to vary the processing parameters to achieve lower effective dielectrics that approximate the lower dielectric constants associated with series capacitors.

Angular Position φ and Angular Rate ω Of Substrate Rotation

The directional anistropy of the columnar growth is capable of being controlled by controlling the rotation of the substrate. Two processing parameters of concern with respect to the rotation of the substrate include the angular position θ and the angular rate ω of substrate rotation. These parameters are generally illustrated in the system embodiment shown in FIG. 6. Because the growth direction of the columns generally follows the direction of the incoming vapor flux, one of ordinary skill in the art will understand upon reading and comprehending this disclosure that the substrate is capable of being rotated to various angular positions φ to change the growth direction of the columns.

In one embodiment, the substrate is rotated through successive angular positions φ in a step-like, intermittent rotating motion. Additionally, one embodiment controls the angular rate ω of motion through various angular positions φ to constantly change the growth direction of the columns. According to one embodiment, the angular rate ω of rotation is relatively constant. In one embodiment, the substrate is rotated through successive angular positions φ in a rotating motion that varies the angular rate of motion between successive angular positions φ. In one embodiment, the angular rate is capable of undergoing various rates of acceleration and deceleration. As one of ordinary skill in the art will understand upon reading and comprehending this disclosure, various helical-like structures are capable of being formed by appropriately controlling the deposition rate (which influences the rate of growth), and the angular position φ and rate ω associated with substrate rotation. One of ordinary skill in the art will understand that the dimensions of these shapes are determined by various processing parameters the deposition rate and the length of time that the incident angle is at certain values.

FIGS. 10A-10B illustrate a dielectric volume, such as that bounded by the metal levels shown in FIG. 4, with helical-shaped columnar structures as formed by one embodiment of the system of FIG. 6. The dielectric volume 1030 illustrated in FIG. 10A includes four equally-spaced helical-shaped columnar structures 1032. One of ordinary skill in the art will understand that the FIG. 10A generally illustrates concepts of the present invention, and will be able to apply the teachings of the present invention to fabricate low-k dielectric for a variety of volumes.

FIG. 10B illustrates a helical-shaped columnar structure and, by use of arrows, the incoming vapor flux. In this embodiment, the angular rate ω of rotation is relatively constant to achieve relatively uniform helical coils that are relatively equally spaced from each other. Arrow 1034 represents the incoming vapor flux at various stages of growth. One of ordinary skill in the art will understand, upon reading and understanding this disclosure, how to appropriately move the substrate so as to achieve the desired vapor flux angle of incidence θ to achieve the growth of a helical-shaped columnar structure. According to one embodiment, which is not expressly shown, the substrate is moved such that the predetermined vapor flux angle of incidence θ is approximately 0° for the last leg of the structure. The deposition process continues for a predetermined amount of time, such as a few seconds, so as to promote the growth of a normal looking film at the surface.

Figures 11A, 11B:
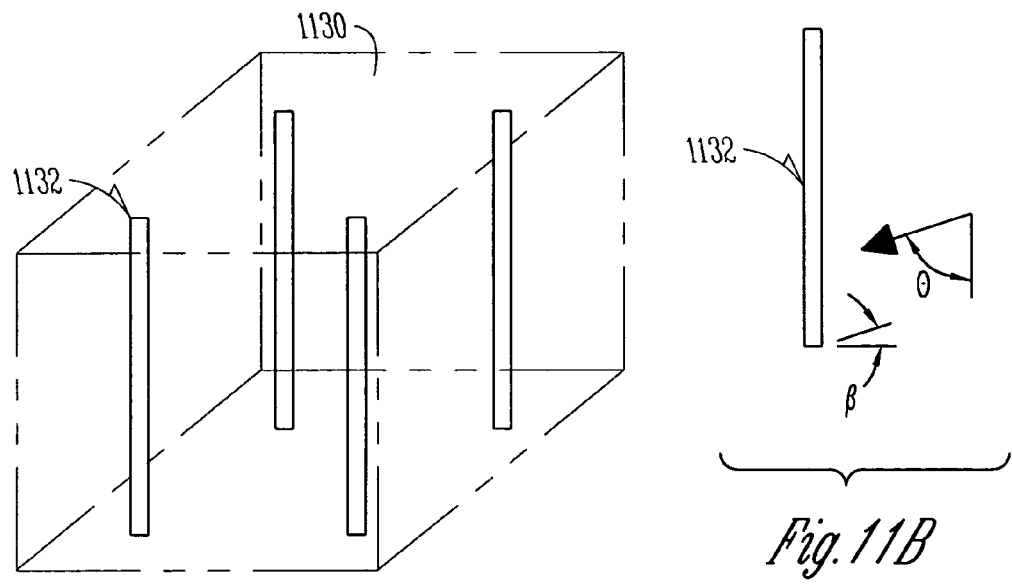
FIGS. 11A-11B illustrate a dielectric volume, such as that bounded by the metal levels shown in FIG. 4, with solid or relatively solid pillar-shaped columnar structures as formed by one embodiment of the system of FIG. 6.

FIGS. 11A-11B illustrate a dielectric volume, such as that bounded by the metal levels shown in FIG. 4, with solid or relatively solid pillar-shaped columnar structures as formed by one embodiment of the system of FIG. 6. In this embodiment, the angular rate ω of rotation of the substrate is sufficiently fast and the deposition rate is sufficiently slow so as to cause the columnar growth in the general shape of a tightly-wound helical-like column. In one embodiment, the windings of the helical-like column are sufficiently tight so as to form solid, or relatively solid, isolated pillars or pillar-shaped columnar structures 1132 within the volume 1130. In one embodiment, these isolated pillars are formed perpendicular to the substrate surface. Each column or helix includes many individual fibers that grow almost parallel to the column axis or to the helix arm direction. The dimensions of the helix or column are determined by the number, diameter, and length of these individual fibers. Malac et al. believe that the compact look of pillars originates from the prompt shadowing of any newly starting fibers by the entire pillar.

Deposition Rate

Generally, larger deposition rates promote faster columnar growth. Even with the above-described shadowing effects, a select number of columns achieve faster columnar growth with larger deposition rates than the columnar growth that would be realized with smaller deposition rates. As referenced above in the discussions with respect to the vapor flux incidence angle $\theta$ and the angular position $\phi$ and rate $\omega$ of substrate rotation, the deposition rate is a factor in the shape and dimensions of the columnar structures that result from manipulating the vapor flux incidence angle $\theta$, the angular position $\phi$ and rate $\omega$ of substrate rotation. The deposition rate is a factor in the shape and dimension of the columnar structures because the growth direction of the columns generally follows the direction of the incoming vapor flux, and because the deposition rate affects the amount of columnar growth that is occurring in the direction of the incoming vapor flux.

Initial Substrate Surface Morphology

The grassy lawn model discussed earlier illustrates the positive feedback effect that an oblique substrate has on columnar growth. Larger columns receive more incoming vapor flux than their shorter neighbors such that the lager columns will grow faster than their shorter neighbors, and will shadow and stunt the growth of neighboring substrate areas even more. Likewise, a patterned substrate that has predetermined "taller" areas during deposition processes promotes columnar growth at these predetermined taller areas at oblique substrate angles such as are present during GLAD processes. For example, one embodiment patterns the substrate with an array of tiny bumps as to promote the growth of a regular array of columns. Each pre-patterned bump shadows its surrounding region to suppress film growth in the surrounding region. In various embodiments, the above-described factors are manipulated to achieve a desired shape for each of the columnar structures. For example, in one embodiment, the factors are manipulated to achieve a helical column; in another embodiment, the factors are manipulated to achieve a solid pillar structure; and in other embodiments, the factors are manipulated to achieve chevrons, staircases, C-shaped columns, S-shaped columns and zig-zag columns. Furthermore, in one embodiment, the substrate is patterned to promote a desired filling factor for the dielectric material. By manipulating these processing factors to achieve a desired shape and filling factor, one of ordinary skill in the art is capable of designing a relatively simple, consistent, timely and cost-effective deposition process for fabricating a desired porous dielectric microstructure with a desired low-k dielectric constant.

Method Aspects

The figures presented and described in detail above are similarly useful in describing the method aspects of the present subject matter. The methods described below are nonexclusive as other methods may be understood from the specification and the figures described above. One aspect provides a relatively simple and cost-effective method for forming a wide variety of insulators in semiconductor applications, such as interconnect dielectrics, and other applications that require or desire an insulator with a low dielectric constant.

Figure 12:
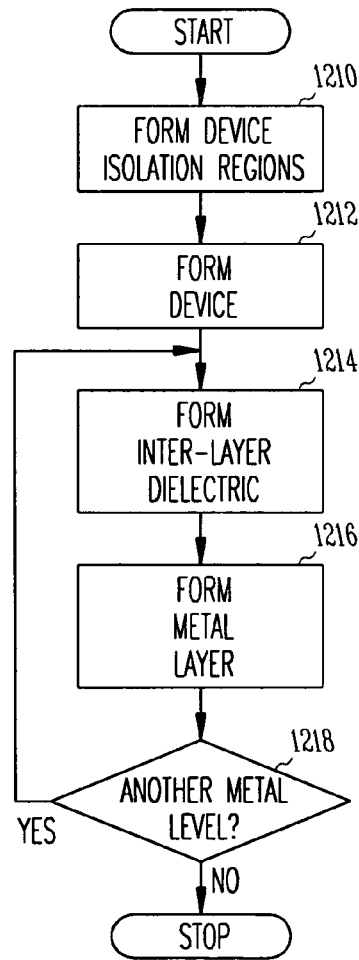
FIG. 12 illustrates one embodiment for forming an integrated circuit.

FIG. 12 illustrates one embodiment for forming an integrated circuit. According to this embodiment, device isolation regions are formed at 1210, and one or more devices are formed at 1212. An inter-layer dielectric over the devices is formed at 1214. At 1216, a metal level is formed over the inter-layer dielectric and is appropriately connected or coupled to the devices. One method for depositing a metal pattern is the dual damascene process. Other methods includes the single damascene or subtractive etch metal process. It is determined at 1218 whether another metal level is to be formed. If it is determined that another metal level is to be formed, then the process returns to 1214 to form another inter-layer dielectric and to form a metal level over the dielectric at 1216 with the appropriate connections to the devices. If it is determined at 1218 that another metal level is not to be formed, then the process terminates. This process of forming another inter-layer dielectric and another metal level is capable of being repeated as many times as necessary to produce the required number of metal levels. Additionally, one of ordinary skill in the art will understand upon reading and comprehending this disclosure that additional layers of devices are capable of being formed. Different dielectric materials are capable of being used in different parts of the integrated circuit, as desired or required by the application.

Figure 13:
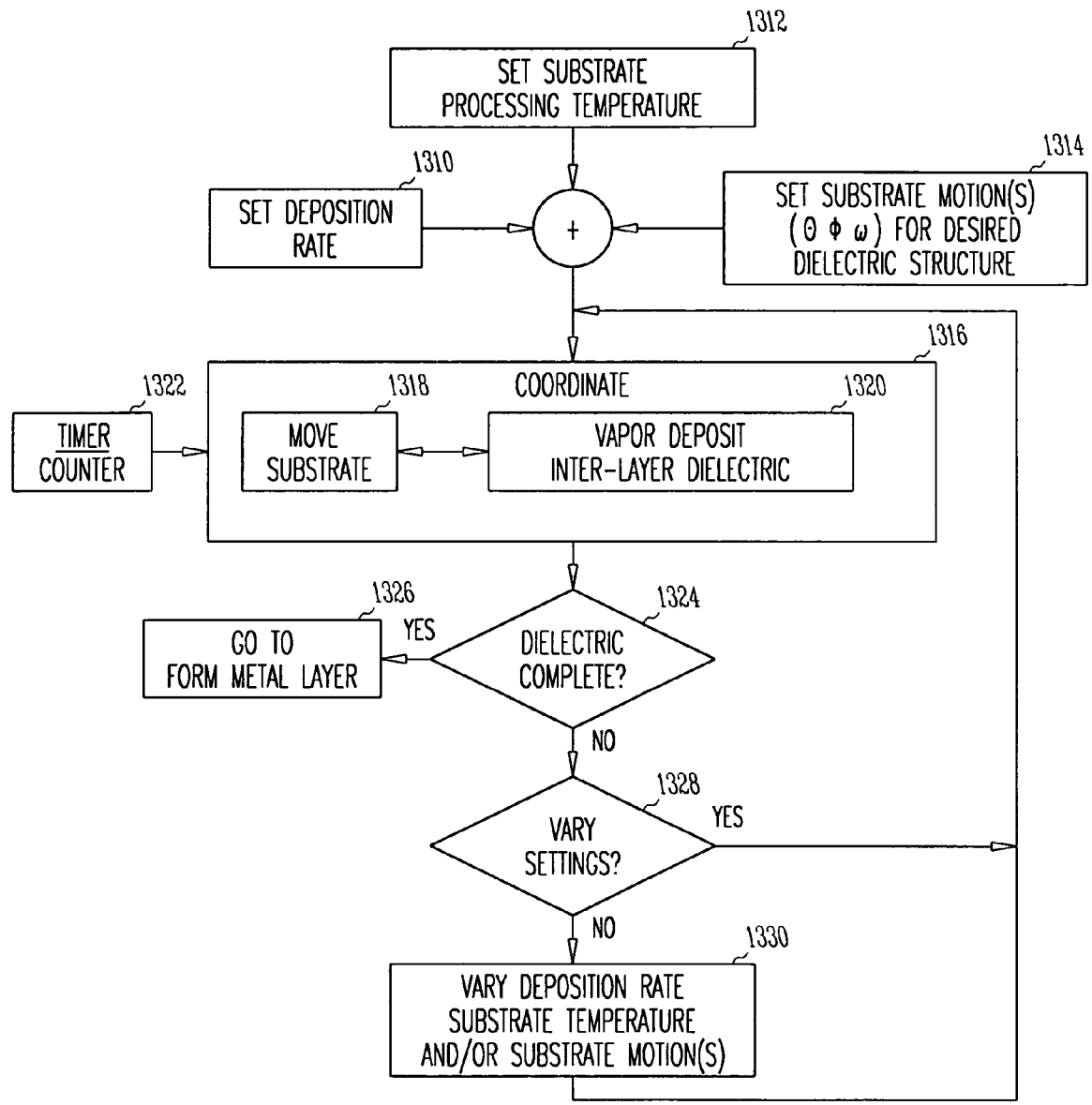
FIG. 13 illustrates one embodiment for forming a low-k insulator for device isolation regions and/or inter-layer dielectrics.

FIG. 13 illustrates one embodiment for forming a low-k insulator for device isolation regions and/or inter-layer dielectrics. In one embodiment, the method illustrated in FIG. 13 is used to form the inter-layer dielectric at 1216 in FIG. 12. According to this embodiment, the deposition rate is set at 1310, the substrate temperature is set at 1312, and the substrate motion(s) ($\theta$, $\phi$, $\omega$) for a desired dielectric microstructure is set at 1314. One of ordinary skill in the art will understand, upon reading and comprehending this disclosure, that the process controller such as that illustrated in FIG. 6 is capable of being used to set the deposition rate, substrate temperature and/or and substrate motion(s) for the deposition process. In one embodiment, a software program resides in the memory of the process controller. The program contains computer-executable instructions adapted to monitor the vapor rate and the motion and/or position of the substrate in conjunction with various sensors (not shown in FIG. 6), and is further adapted to provide control signals to various controls (not shown in FIG. 6) for the vapor source and a mechanism for moving the substrate.

At 1316, a coordination process occurs between the substrate motion and the vapor deposition of inter-layer dielectric. At 1318, the substrate is moved into a desired position for the vapor deposition of the inter-layer dielectric at 1320. According to various embodiments, the motion of the substrate includes motions for adjusting the vapor flux incident angle $\theta$, the angular position $\phi$ of the substrate with respect to a fixed position, and/or an angular rate $\omega$ of rotation of the substrate. One of ordinary skill in the art will understand, upon reading and comprehending this disclosure, that the movement of the substrate at 1316 and the vapor deposition at 1318 are coordinated to achieve a columnar structures of a desired shape. According to one embodiment, a timer/counter 1322, such as that provided by the process controller of FIG. 6 for example, is used in the coordination process 1316.

It is determined at 1324 whether the fabrication process for the dielectric is complete. Upon determining that the fabrication process for the dielectric is complete, one embodiment of the process proceeds to 1326 to go form a metal layer on the inter-layer dielectric. Upon determining that the fabrication process for the dielectric is not complete, one embodiment of the process proceeds to 1328 to determine whether the process settings or parameters (such as deposition rate, the substrate temperature, the vapor flux incident angle θ, the angular position φ of the substrate with respect to a fixed position, and/or an angular rate ω of rotation of the substrate) need to be varied. Upon determining that the settings or parameters do not need to be varied, the process proceeds to 1316 where a coordinated vapor deposition and substrate motion occur to appropriately continue the fabrication process. Upon determining that the settings or parameters need to be varied, the process proceeds to 1330 to appropriately vary the deposition rate, substrate temperature and/or substrate motion(s), and then proceeds to 1316 where a coordinated vapor deposition and substrate motion occur to appropriately continue the fabrication process.

Electronic System Aspect

Figure 14:
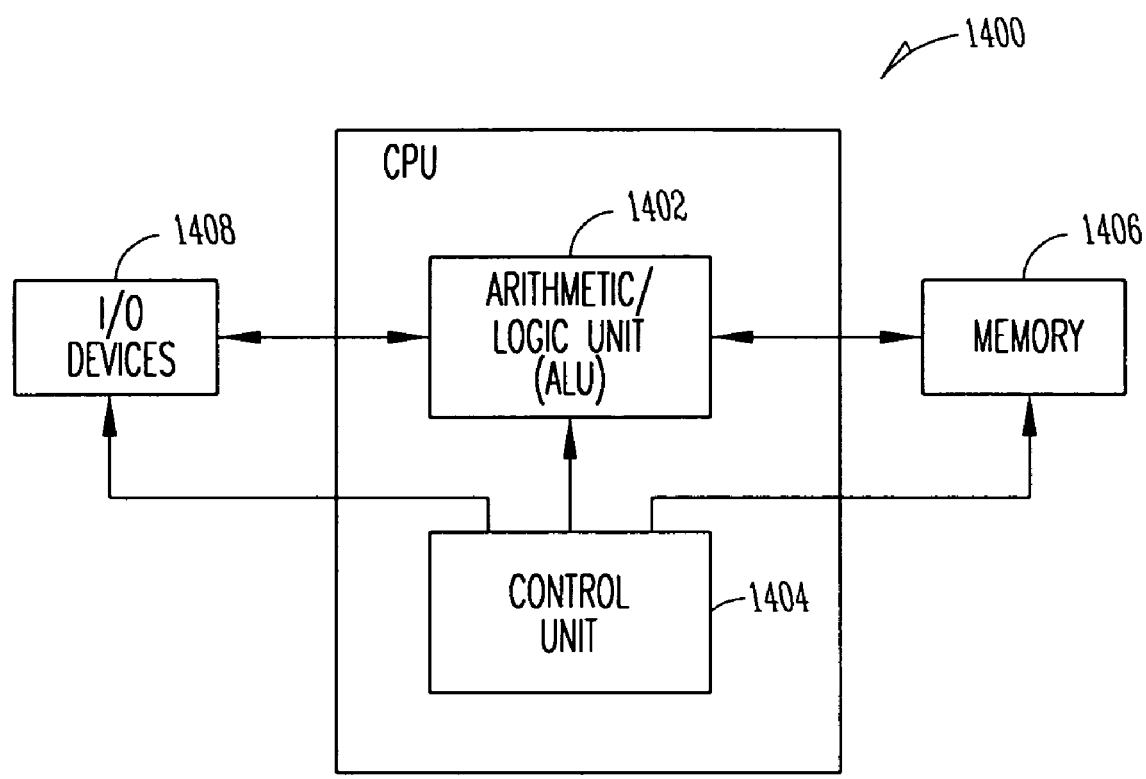
FIG. 14 is a simplified block diagram of a high-level organization of an electronic system according to the teachings of the present invention.

FIG. 14 is a simplified block diagram of a high-level organization of an electronic system according to the teachings of the present invention. The electronic system 1400 has functional elements, including a processor or arithmetic/logic unit (ALU) 1402, a control unit 1404, a memory device unit 1406 and an input/output (I/O) device 1408. Generally such an electronic system 1400 will have a native set of instructions that specify operations to be performed on data by the processor 1402 and other interactions between the processor 1402, the memory device unit 1406 and the I/O devices 1408. The control unit 1404 coordinates all operations of the processor 1402, the memory device 1406 and the I/O devices 1408 by continuously cycling through a set of operations that cause instructions to be fetched from the memory device 1406 and executed. The processor 1402 and/or memory device 1406, for example, are formed as integrated circuits with a low-k dielectric material according to the teachings of the present invention, thus lowering the RC time delay and improving the performance of the integrated circuits and the overall electronic system.

CONCLUSION

The present subject matter improves integrated circuit performance by reducing the RC time constant of interconnects. The present subject matter provides a low-k dielectric insulator for integrated circuit interconnects that is easily and consistently prepared in a timely and cost-effective manner. The low-k dielectric insulator of the present invention is vapor deposited at predetermined angle(s) of incidence with respect to a normal vector of a substrate surface so as to promote columnar growth that results in porous dielectric microstructures. Various parameters are capable of being manipulated to control the columnar morphology to control the porosity of the inter-layer dielectric material and achieve a lower effective dielectric constant ($k_{eff}$). These parameters include deposition rate, substrate temperature, incident angle θ of vapor flux, substrate rotation (angular position φ and rate ω), and initial morphology of a patterned or modulated substrate surface. As such, the present invention provides a system and method that improves integrated circuit performance by reducing the interconnect RC time constant.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit structure, comprising:
a plurality of columnar structures, the columnar structures including a dielectric material deposited using a glancing angle deposition (GLAD) process, the columnar structures being adapted to provide a porous dielectric material with an effective dielectric constant approximately equal to half of a dielectric constant of the dielectric material.

2. The structure of claim 1, wherein the plurality of columnar structures are formed over a patterned substrate.

3. The structure of claim 1, wherein the dielectric material includes a silicon oxide, and the effective dielectric constant of the porous dielectric material is less than or approximately equal to 1.95.

4. The structure of claim 3, wherein the silicon oxide includes a silicon monoxide (SiO).

5. The structure of claim 3, wherein the silicon oxide includes a silicon dioxide ($SiO_2$).

6. The structure of claim 1, wherein the columnar structures include a predetermined shape determined by a set of processing parameters, including a substrate temperature, a vapor flux incidence angle, and an angular position of the substrate.

7. The structure of claim 1, wherein the columnar structures include columnar structures of a zig-zag shape, a C-shape, or an S-shape.

8. The structure of claim 1, wherein the columnar structures include columnar structures of a helical shape.

9. An integrated circuit structure, comprising:
a plurality of columnar structures, the columnar structures including a dielectric material deposited using a glancing angle deposition (GLAD) process, the columnar structures including a predetermined shape determined by a set of processing parameters, including a substrate temperature, a vapor flux incidence angle, and an angular position of the substrate, the columnar structures being adapted to provide a porous dielectric material with an effective dielectric constant approximately equal to half of a dielectric constant of the dielectric material.

10. The structure of claim 9, wherein the dielectric material includes silicon oxide.

11. The structure of claim 9, wherein the vapor flux incidence angle is larger than 70°.

12. The structure of claim 9, wherein the columnar structures include columnar structures of a helical shape.

13. A method, comprising:
forming a plurality of columnar structures, including depositing a dielectric material using a glancing angle deposition (GLAD) process to provide a porous dielectric material with an effective dielectric constant approximately equal to half of a dielectric constant of the dielectric material.

14. The method of claim 13, further including patterning a substrate with bumps upon which the columnar structures are formed using the GLAD process.

15. The method of claim 13, wherein depositing the dielectric material includes depositing a silicon oxide.

16. The method of claim 13, wherein depositing the dielectric material using the GLAD process includes controlling processing parameters, including controlling a substrate temperature, controlling a vapor flux incidence angle, and controlling an angular position of the substrate.

17. The method of claim 13, wherein forming the plurality of columnar structures includes coordinating vapor deposition and substrate motion.

18. The method of claim 17, wherein forming the plurality of columnar structures includes coordinating vapor deposition and substrate motion to form columnar structures with a zig-zag shape.

19. The method of claim 17, wherein forming the plurality of columnar structures includes coordinating vapor deposition and substrate motion to form columnar structures with a C-shape.

20. The method of claim 17, wherein forming the plurality of columnar structures includes coordinating vapor deposition and substrate motion to form columnar structures with an S-shape.

21. The method of claim 17, wherein forming the plurality of columnar structures includes coordinating vapor deposition and substrate motion to form columnar structures with a helical shape.

22. A system, comprising:
  means for forming a plurality of columnar structures, including means for depositing a dielectric material using a glancing angle deposition (GLAD) process to provide a porous dielectric material with an effective dielectric constant approximately equal to half of a dielectric constant of the dielectric material.

23. The system of claim 22, further including means for patterning a substrate with bumps upon which the columnar structures are formed using the GLAD process.

24. The system of claim 22, wherein the means for depositing the dielectric material using the GLAD process includes means for controlling processing parameters, including means for controlling a substrate temperature, means for controlling a vapor flux incidence angle, and means for controlling an angular position of the substrate.

25. The system of claim 22, wherein the means for forming the plurality of columnar structures includes means for coordinating vapor deposition and substrate motion.

26. The system of claim 25, wherein the means for forming the plurality of columnar structures includes means for coordinating vapor deposition and substrate motion to form columnar structures with a zig-zag shape.

27. The system of claim 25, wherein the means for forming the plurality of columnar structures includes means for coordinating vapor deposition and substrate motion to form columnar structures with a C-shape.

28. The system of claim 25, wherein the means for forming the plurality of columnar structures includes means for coordinating vapor deposition and substrate motion to form columnar structures with an S-shape.

29. The system of claim 25, wherein the means for forming the plurality of columnar structures includes means for coordinating vapor deposition and substrate motion to form columnar structures with a helical shape.

* * * * *

UNITED STATES PATENT AND TRADEMARK OFFICE
CERTIFICATE OF CORRECTION

PATENT NO. : 7,485,942 B2  
APPLICATION NO. : 11/406186  
DATED : February 3, 2009  
INVENTOR(S) : Ahn et al.

Page 1 of 1

It is certified that error appears in the above-identified patent and that said Letters Patent is hereby corrected as shown below:

In column 14, lines 23-24, in Claim 2, delete "colunmar" and insert -- columnar --, therefor.

In column 14, line 44, in Claim 9, delete "colunmar" and insert -- columnar --, therefor.

Signed and Sealed this

Fifth Day of May, 2009

JOHN DOLL  
*Acting Director of the United States Patent and Trademark Office*